United States Patent
Chou et al.

(10) Patent No.: US 7,431,811 B2
(45) Date of Patent: *Oct. 7, 2008

(54) RUTHENIUM OXIDE ELECTRODES AND FABRICATION METHOD THEREOF

(75) Inventors: Jung-Chuan Chou, Douliou (TW); Sheng-Hung Chen, Taipei (TW)

(73) Assignee: National Yunlin University of Science and Technology, Yunlin (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/563,132

(22) Filed: Nov. 24, 2006

(65) Prior Publication Data

US 2007/0261955 A1 Nov. 15, 2007

(30) Foreign Application Priority Data

May 9, 2006 (TW) .............................. 95116377 A

(51) Int. Cl.
*C25B 11/04* (2006.01)

(52) U.S. Cl. ................. 204/291; 204/433; 204/435; 204/403.1; 204/192.1; 204/192.15; 204/192.17

(58) Field of Classification Search ................ 204/291, 204/433, 435, 403.1, 192.1, 192.15, 192.17
See application file for complete search history.

(56) References Cited

U.S. PATENT DOCUMENTS

| 4,982,309 A * | 1/1991 | Shepherd ................. 361/321.3 |
| 5,358,889 A | 10/1994 | Emesh et al. |
| 5,619,393 A | 4/1997 | Summerfelt et al. |
| 5,739,049 A * | 4/1998 | Park et al. ...................... 438/3 |
| 6,239,460 B1 | 5/2001 | Kuroiwa et al. |
| 6,383,363 B2 * | 5/2002 | Jow et al. ..................... 205/704 |
| 2007/0095664 A1 * | 5/2007 | Chou et al. ................. 204/433 |
| 2007/0155037 A1 * | 7/2007 | Chou et al. ................... 438/49 |

* cited by examiner

*Primary Examiner*—Bruce F Bell
(74) *Attorney, Agent, or Firm*—Quintero Law Office

(57) ABSTRACT

A ruthenium oxide electrode. The ruthenium oxide electrode includes a substrate, a ruthenium oxide film formed thereon, and a conductive wire connecting to the ruthenium oxide film. The invention also provides a method of fabricating the ruthenium oxide electrode.

14 Claims, 4 Drawing Sheets

RUTHENIUM OXIDE ELECTRODES AND FABRICATION METHOD THEREOF

BACKGROUND OF THE INVENTION

1. Field of the Invention

The invention relates to a biosensor, and in particular to a ruthenium oxide electrode and fabrication method thereof.

2. Description of the Related Art

Ruthenium (Ru), a noble metal, as an oxide possesses super-high capacitance due to double layer mechanism and pseudo-capacitance resulting from redox with solution on the surface of ruthenium oxide. The latter provides a tenfold increase in charge storage capacity. Ruthenium dioxide is similar to metal in its low resistivity (less to $10^{-4}$ ohm·cm) and high surface area (about 800-1000 $m^2/g$). Other advantages include high conductance, multi-redox-active pairs [Ru(II)-Ru(III)-Ru(IV)-Ru(V)-Ru(VI)-Ru(VII)], superior adhesion with enzymes and compounds, reversibility in electrochemistry, stability in acid solution, and application in pH-measuring membrane material.

In 2002, Erlenkotter et al. (A. Erlenkotter, M. Kottbus, G. C. Chemnitius, "Flexible amperometric transducers for biosensors based on a screen printed three electrode system", Journal of Electroanalytical Chemistry, vol. 481, pp. 82-94, 2000.) presented the kinetics parameters of electrodes with changed scan rate. The active surface area of the Pt working electrode was determined using electrochemical studies. Cyclic voltammograms of the ferricyanide/ferrocyamide couple showed that the reaction was quasi-reversible at these electrodes.

A number of patents related to ruthenium oxide membrane and fabrication methods are summarized as follows.

U.S. Pat. No. 6,383,363, inventors: Jow; T. Richard (Chatham, N.J.); Zheng; Jian-Ping (Eatontown, N.J.), patent title: "Proton inserted ruthenium oxide electrode material for electrochemical capacitors", Pub. Date: May 7, 2002, abstract: A high energy density electrochemical capacitors with electrodes is formed from proton inserted ruthenium oxides (e.g. $HRuO_2.xH_2O$ or $HRuO_2$). The electrode material is formed by reducing ruthenium oxides (e.g. $RuO_2.xH_2O$ or $RuO_2$) using electrochemical method or chemical reaction between ruthenium oxides with acetone or methanol. Electrochemical capacitors with electrodes formed of proton inserted ruthenium oxides possess higher energy density, lower resistance, broader operating temperature range, and longer lifetime than that with electrodes comprised ruthenium oxides.

U.S. Pat. No. 6,239,460, inventors: Kuroiwa; Takeharu (Tokyo, JP); Horikawa; Tsuyoshi (Tokyo, JP); Makita; Tetsuro (Tokyo, JP); Mikarni; Noboru (Tokyo, JP); Shibano; Teruo (Tokyo, JP), patent title: "Semiconductor device which includes a capacitor having a lower electrode formed of iridium or ruthenium", Pub. Date: May 29, 2001, abstract: A semiconductor device such as DRAM including a capacitor, wherein a lower electrode of the capacitor is a metal electrode, the metal electrode being mainly composed of ruthenium or iridium, and being connected directly to a capacitor dielectric film through no oxide layer of materials of the metal electrode formed on the surface of the metal electrode. The lower electrode made of iridium or ruthenium can easily be processed as compared with the conventional case where platinum is employed to form the electrode and also can not be oxidized when the capacitor dielectric film is formed, thus reduction in the capacitance can be prevented.

U.S. Pat. No. 5,619,393, inventors: Summerfelt; Scott R. (Dallas, Tex.); Beratan; Howard R. (Richardson, Tex.); Gnade; Bruce E. (Dallas, Tex.), patent title: "High-dielectric-constant material electrodes comprising thin ruthenium dioxide layers", Pub. Date: Apr. 8, 1997, abstract: A preferred embodiment of this invention comprises a thin unreactive film (e.g. ruthenium dioxide) contacting a high-dielectric-constant material (e.g. barium strontium titanate) to an electrode. The thin unreactive film provides a stable conductive interface between the high-dielectric-constant material layer and the electrode base (e.g palladium). As opposed to a standard thin-film layer, the thin unreactive film is generally less than 50 nm thick, preferably less than 35 µm thick, more preferably between 5 nm and 25 nm thick, and most preferably between 10=m and 20 nm thick. A thin unreactive film benefits from the advantages of the materials used while avoiding or minimizing many of the disadvantages. A thin unreactive film is substantially less costly than a standard thin-film layer since much less material is used while not significantly affecting the surface area of the electrode in contact with the HDC material. These structures may also be used for multilayer capacitors and other thin-film ferroelectric devices such as pyroelectric materials, non-volatile memories, thin film piezoelectric and thin film electro-optic oxides.

U.S. Pat. No. 5,358,889, inventors: Emesh; Ismail T. (Cumberland, Calif.); McDonald; David R. (Ottawa, Calif.), patent title: "Formation of ruthenium oxide for integrated circuits", Pub. Date: Oct. 25, 1994, abstract: A method is provided for forming a conductive layer of ruthenium oxide layer $RuO_2$. The $RuO_2$ layer is formed from a coating of a precursor solution comprising a ruthenium (III) nitrosyl salt, subsequent heat treatment, and annealing at low temperature. The resulting layer of a tetragonal phase of crystalline ruthenium oxide is suitable to receive formation thereon of a perovskite structure ferroelectric material for applications in ferroelectric non-volatile memory cells. The chloride free process is compatible with processing for submicron device structures for bipolar, CMOS or bipolar CMOS integrated circuits.

BRIEF SUMMARY OF THE INVENTION

The invention provides a ruthenium oxide electrode comprising a substrate, a ruthenium oxide film formed thereon, and a conductive wire connecting to the ruthenium oxide film.

The invention also provides a method of fabricating a ruthenium oxide electrode, in which substrate is provided on which ruthenium sputtering is performed to form a ruthenium oxide film. A conductive wire is formed to connect the ruthenium oxide film.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawing, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The invention provides a ruthenium oxide electrode comprising a substrate, a ruthenium oxide film formed thereon, and a conductive wire connecting to the ruthenium oxide film.

Figure 1:
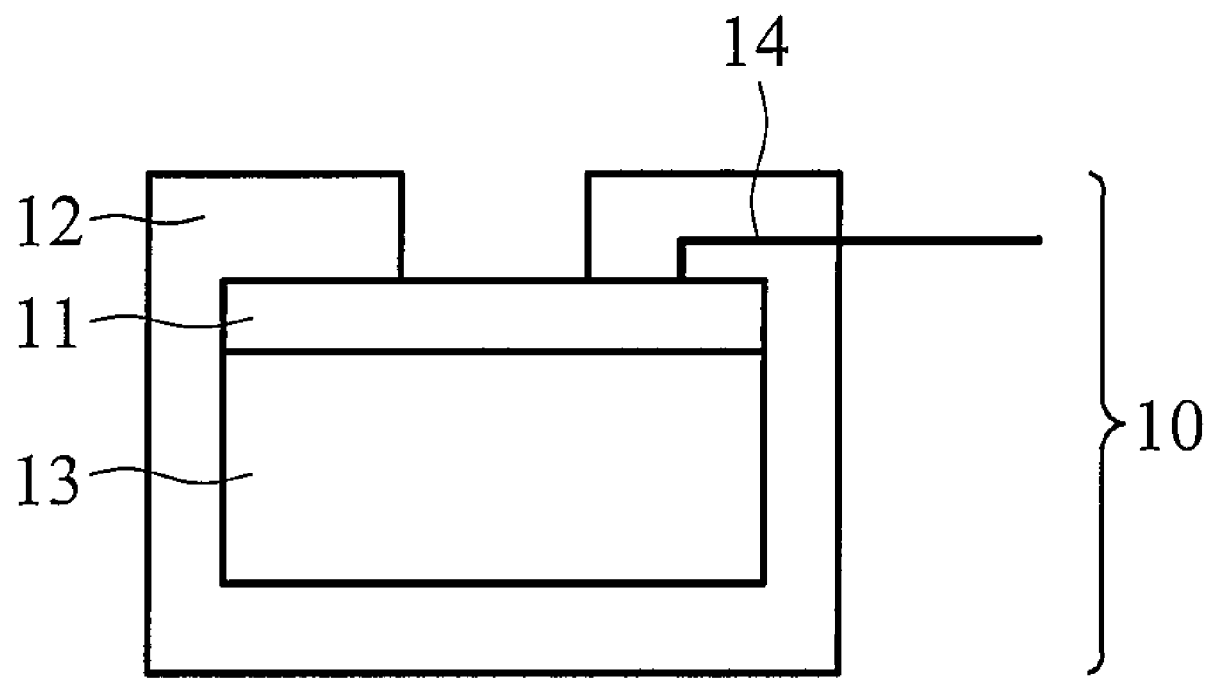
FIG. 1 shows a cross section of a ruthenium oxide electrode of the invention.

The ruthenium oxide electrode structure is shown in FIG. 1. The ruthenium oxide electrode structure 10 comprises a substrate 13, a ruthenium oxide film 11 formed thereon, and a conductive wire 14 connecting to the ruthenium oxide film 11.

The substrate 13 may be a semiconductor substrate such as p-type and have a resistivity of about 8~12 Ωcm. The surface of the substrate 13 may be parallel to (100) plane. The ruthenium oxide electrode structure 10 further comprises an entrapment layer 12 covering the substrate 13, the ruthenium oxide film 11, and the conductive wire 14, exposing a part of the ruthenium oxide film 11 to contact the test solution. The entrapment layer 12 may comprise epoxy resin.

The invention also provides a method of fabricating a ruthenium oxide electrode, comprising the following steps. Still referring to FIG. 1, a substrate 13 is provided. A ruthenium sputtering is performed to form a ruthenium oxide film 11 on the substrate 13. A conductive wire 14 is formed to connect the ruthenium oxide film 11.

A mixed gas comprising such as Ar and $O_2$ is introduced while performing the ruthenium sputtering. The introduced gas has a flow ratio of about 30~40:10~20 (Ar/$O_2$), preferably 40/15 (Ar/$O_2$). The ruthenium sputtering has a pressure of about 5~30 mtorr, preferably 10 mtorr. The ruthenium sputtering has a power of about 80~120 W, preferably 100 W. The ruthenium oxide electrode 10 is further covered by an entrapment layer 12, exposing a part of the ruthenium oxide film 11.

The ruthenium oxide film is prepared utilizing a RF sputtering system, which has advantages as follows. Sputtering insulator materials and parameters of grown film, i.e. substrate temperature, sputtering pressure and power, and so on, can be easily controlled.

In the invention, several electrochemical parameters, such as hydrogen ion diffusion coefficient and active surface area, of the ruthenium oxide electrode can also be estimated, comprising the following steps. A ruthenium oxide electrode is placed in an electrolyte. The current response of the ruthenium oxide electrode is then measured with continuous time by a chronoamperometric (CA) technique. Next, by plotting the current response versus time, the relationship between I(t) and $t^{-1/2}$ is obtained. Finally, the diffusion coefficient ($D_o$) is estimated by Cottrell equation (Eq. (1)). While talking the place of the diffusion coefficient ($D_o$) into Limiting current formula (Eq. (2)), the diffusion length (L) is calculated.

Cottrell Formula $$I(t) = \frac{nFAD^{1/2}}{\pi^{1/2}t^{1/2}}C_{H^+} \tag{1}$$

Limiting Current Formula $$I = nFA\frac{D}{L}C_{H^+} \tag{2}$$

where n is the number of electrons, F is Faraday constant, A is the sensing area, D is the diffusion coefficient, $C_{H^+}$ is the bulk concentration, and L is the diffusion length.

The kinetics parameter is also calculated. For the quasi-reversible system, it presented the kinetics parameter of the electrode with changed scan rate.

$$\ln|I_{pc}| = \ln|nFk_0^{ap}c_o| - \frac{\alpha^{ap}nF}{RT}\Delta E \tag{3}$$

$$I_{pc} = -3.01 \times 10^5 n^{3/2} \alpha^{ap1/2} D_o^{1/2} Ac_o|v|^{1/2} \tag{4}$$

where $I_{pc}$ is the cathode peak height, $\Delta E$ is the peak to peak separation, $K_o^{ap}$ is the standard heterogeneous rate constant, $\alpha^{ap}$ is the apparent transfer coefficient, $C_o$ is the bulk concentration, R is the gas constant, T is the absolute temperature, A is the sensing area, and v is the scan rate.

EXAMPLE 1

Preparation of the Ruthenium Oxide Film

A p-type semiconductor substrate (100) with a resistivity ranging from 8 to 12 Ω·cm was placed in a deposition chamber introduced by a mixed gas (Ar/$O_2$) of 40 sccm/15 sccm (Ar/$O_2$) flow ratio under $10^{-6}$ torr. A ruthenium target (99.99%) with 2 inch diameter and 3 mm thick was then sputtered under 0.01 torr and 100W at 13.56 MHz (Model: SKN-05P, Japan) for 20 minutes to form a ruthenium oxide film on the substrate.

EXAMPLE 2

Preparation of the Electrolyte (1) Potassium phosphate ($KH_2PO_4$ (Sigma Chemical Co. Ltd., USA), $K_2HPO_4$ (Sigma Chemical Co. Ltd., USA)) was dissolved in deionized water to form a 0.1M phosphate buffer solution with pH7.5.

(2) 395.11 mg $K_3[Fe(CN)_6]$ (electron-transfer mediator) was mixed with 80 ml phosphate buffer solution and stirred to prepare a 15 mM electrolyte.

(3) The electrolytes with various concentrations such as 20, 25, 30, 35, 40, 45, 50, and 100 mM were prepared.

EXAMPLE 3

Electrochemical Analysis (1) Electrical Conductivity Test (a) A cyclic voltammetry (CV) three-electrode comprising a platinum (wire) counter electrode, an Ag/AgCl reference electrode, and a ruthenium oxide work electrode was set.

(b) For the CV measurement, the potential was swept from −0.6 to 0.2V with a scan rate of 25 mV/sec.

(c) The three electrodes were respectively placed in electrolytes with varied electron-transfer mediator concentrations. After steadying for several minutes, various response currents and potentials were recorded.

Figure 2:
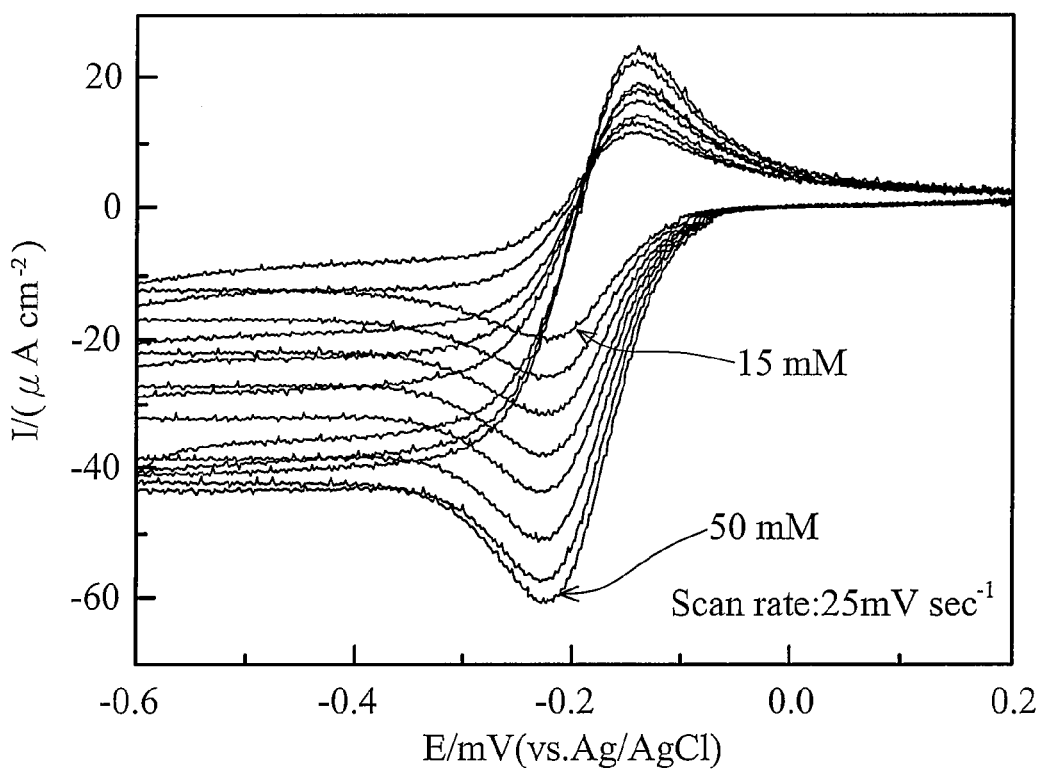
FIG. 2 shows cyclic voltammograms of a ruthenium oxide electrode of the invention.

The test results are shown in FIG. 2. It is clear that the ruthenium oxide electrode has a reversible cyclic voltammogram. The two peaks indicate that the couple redox occurs.

Thus, the sputtered ruthenium oxide electrode possesses optimal electrical conductivity and linearity.

(2) Estimation of Diffusion Coefficient

A ruthenium oxide electrode was placed in an electrolyte. The current response of the ruthenium oxide electrode was then measured with continuous time by a chronoamperometric (CA) technique. Next, by plotting the current response versus time, the relationship between I(t) and $t^{-1/2}$ was obtained. Finally, the diffusion coefficient ($D_o$) was estimated by Cottrell equation (Eq. (1)). While taking the place of the diffusion coefficient ($D_o$) into Limiting current formula (Eq. (2)), the diffusion length (L) was calculated.

Figure 3:
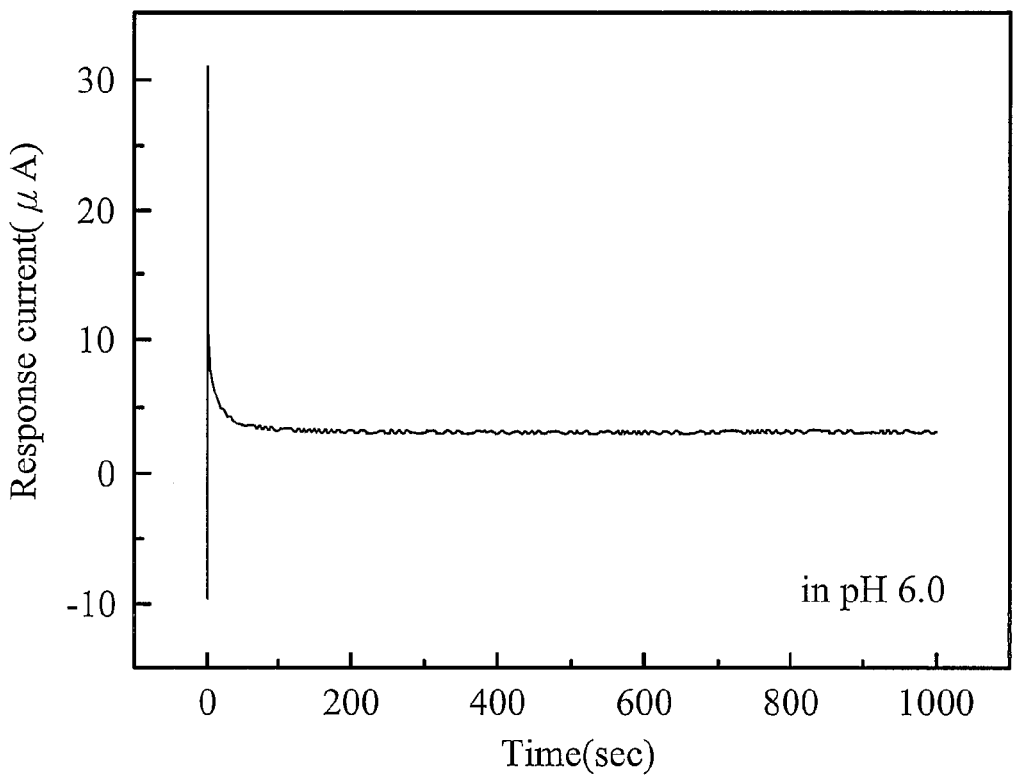
FIG. 3 shows a CA plot of a ruthenium oxide electrode of the invention.
Figure 4:
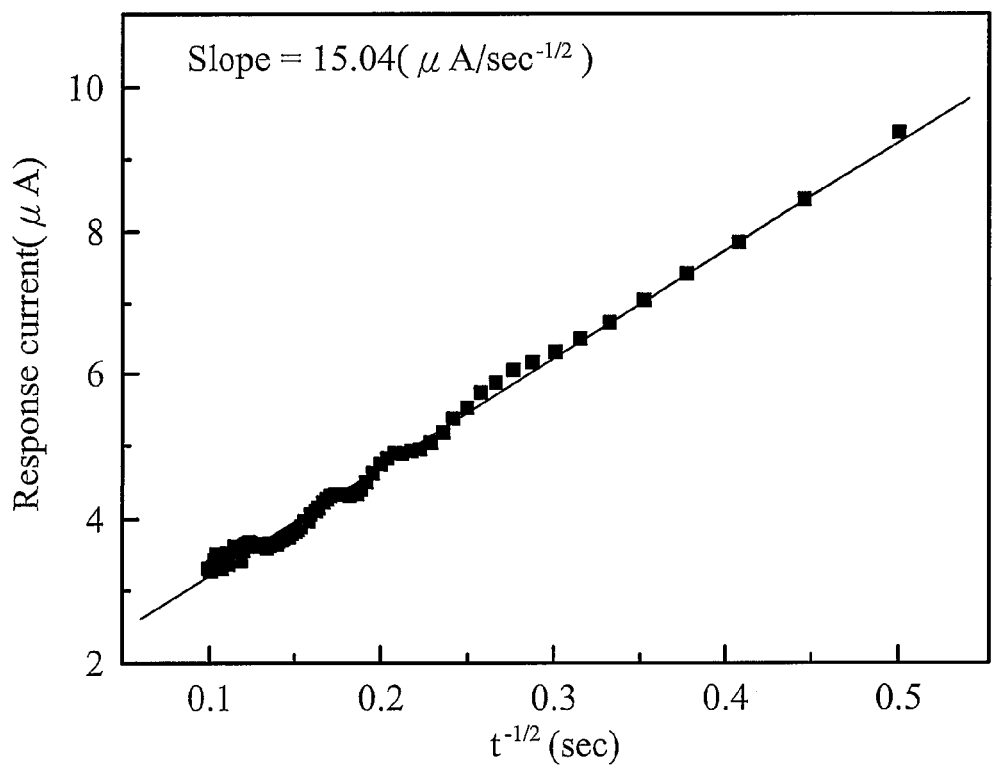
FIG. 4 shows the slope relationship between I(t) and $t^{-1/2}$ at CA operating of the invention.

FIG. 3 shows a CA plot of the ruthenium oxide electrode. FIG. 4 shows the slope relationship between I(t) and $t^{-1/2}$ at CA operation. The slope of 15.04 μA/sec$^{-1/2}$ in FIG. 4 was taken into Eq. (1) and the hydrogen ion diffusion coefficient (D) of $4.77 \times 10^{-11}$ cm$^2$/sec was obtained. Based on Eq. (2), the diffusion length (L) of $5.8 \times 10^{-5}$ cm is obtained.

The diffusion and pH-response drift are highly affected by the quality of the ruthenium oxide film, such as film composition, structure, thickness, porosity, and homogeneity. The diffusion coefficient, however, is a constant and independent of the film thickness. It is demonstrated that this data presents the authenticity, the diffusion coefficient (D) of 240 nm thickness is similar to that of 1100 nm thickness, that are characterized by a hydrogen ion diffusion coefficient of $4.77 \times 10^{11}$ cm$^2$/sec and $3.21 \times 10^{-1}$ cm$^2$/sec, respectively.

(3) Measurement of Active Surface Area (a) A cyclic voltammetry (CV) three-electrode comprising a platinum (wire) counter electrode, an Ag/AgCl reference electrode, and a ruthenium oxide work electrode was set.

(b) For the CV measurement, the potential was swept from −0.6 to 0.2V with scan rates of 10, 25, and 50 mV/sec, respectively.

(c) The three electrodes were placed in a 0.1M electrolyte. After steadying for several minutes, various response current and potential were recorded.

(d) The apparent transfer coefficient ($\alpha^{ap}$) and the standard heterogeneous rate constant ($K_0^{ap}$) were estimated by Eq. (3).

(e) The apparent transfer coefficient ($\alpha^{ap}$) and the diffusion coefficient ($D_0$) of $7.6 \times 10^{-6}$ cm$^2$/sec were taken into Eq. (4). The active area (A) of the ruthenium oxide electrode was obtained.

Figure 5:
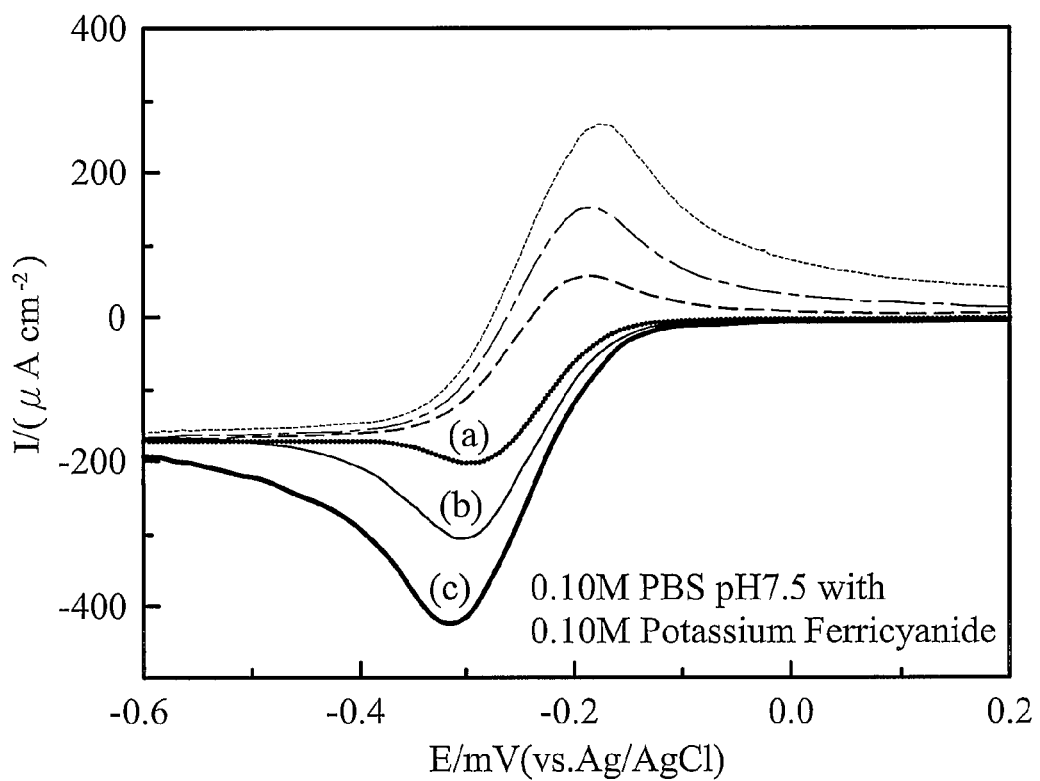
FIG. 5 shows the CV of the ruthenium oxide electrode with varied scan rates of the invention.
Figure 6:
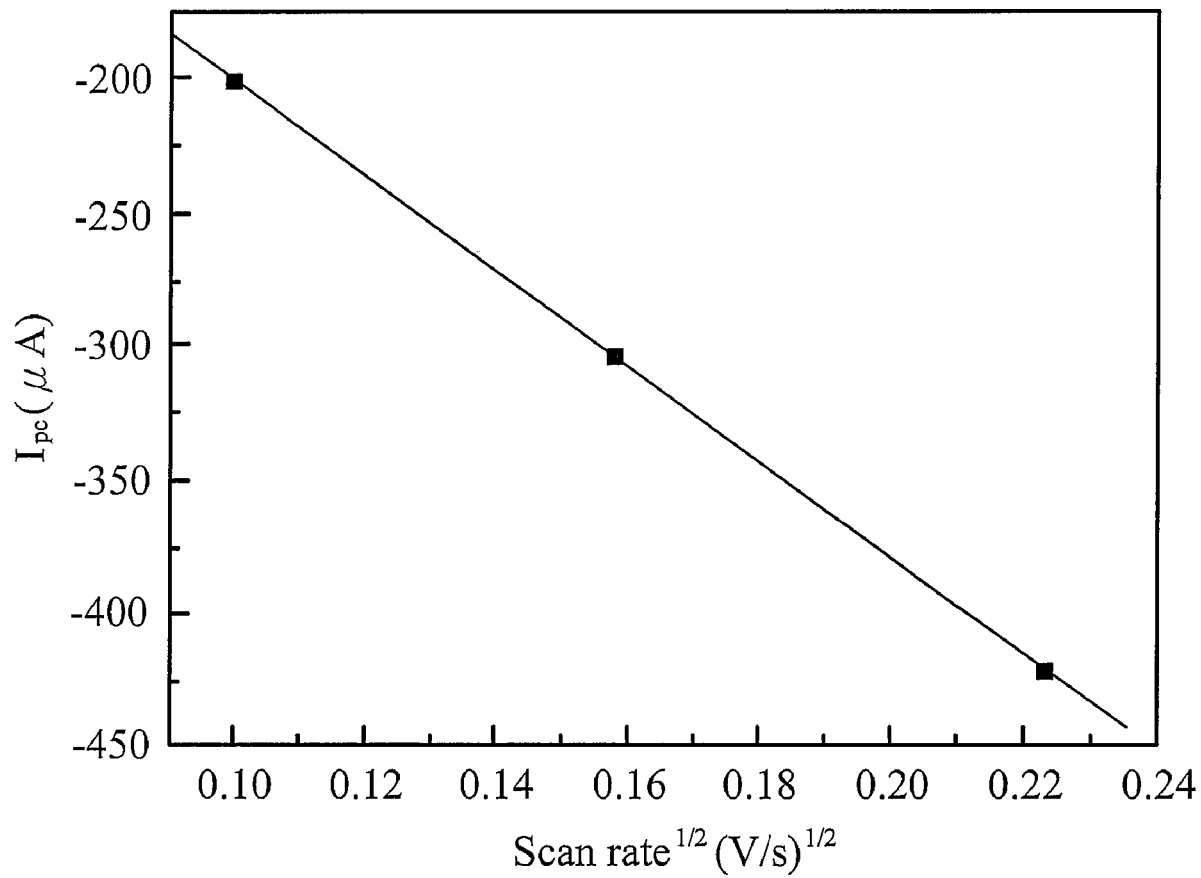
FIG. 6 shows the slope relationship between the $I_{pc}$ and $v^{1/2}$ at CV operating of the invention.

FIG. 5 shows the cyclic voltammograms of the ruthenium oxide electrode at varied scan rates. FIG. 6 shows the slope relationship between the $I_{pc}$ and $v^{1/2}$ at CV operating.

According to the results described, the ruthenium oxide electrode provided by the invention possesses optimal electrical conductivity. The hydrogen ion diffusion coefficient thereof is about $3 \sim 5 \times 10^{-11}$ cm$^2$/sec. Moreover, the standard heterogeneous rate constant ($K_0^{ap}$) is calculated from the measurement results, ranging from 3 to $3.5 \times 10^{-5}$ cm/sec, suitable for the quasi-reversible reaction.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A ruthenium oxide electrode, comprising:
    a substrate;
    a ruthenium oxide film formed thereon;
    an entrapment layer covering the ruthenium oxide film to expose a part of the ruthenium oxide film; and
    a conductive wire connecting to the ruthenium oxide film.

2. The ruthenium oxide electrode as claimed in claim 1, wherein the substrate is a p-type semiconductor substrate.

3. The ruthenium oxide electrode as claimed in claim 1, wherein the substrate has a resistivity of about 8~12 Ω·cm.

4. The ruthenium oxide electrode as claimed in claim 1, wherein the substrate has a surface parallel to (100) plane.

5. The ruthenium oxide electrode as claimed in claim 1, wherein the entrapment layer comprises epoxy resin.

6. A method of fabricating a ruthenium oxide electrode, comprising:
    providing a substrate;
    performing a ruthenium sputtering to form a ruthenium oxide film thereon;
    covering an entrapment layer over the ruthenium oxide film, exposing a part of the ruthenium oxide film; and
    forming a conductive wire to connect the ruthenium oxide film.

7. The method of fabricating a ruthenium oxide electrode as claimed in claim 6, wherein the ruthenium sputtering has an introduced gas of Ar and $O_2$.

8. The method of fabricating a ruthenium oxide electrode as claimed in claim 7, wherein the introduced gas has a flow ratio of about 30~40:10~20 (Ar/$O_2$).

9. The method of fabricating a ruthenium oxide electrode as claimed in claim 7, wherein the introduced gas has a flow ratio of 40/15 (Ar/$O_2$).

10. The method of fabricating a ruthenium oxide electrode as claimed in claim 6, wherein the ruthenium sputtering has a pressure of about 5 ~30 mtorr.

11. The method of fabricating a ruthenium oxide electrode as claimed in claim 6, wherein the ruthenium sputtering has a pressure of 10 mtorr.

12. The method of fabricating a ruthenium oxide electrode as claimed in claim 6, wherein the ruthenium sputtering has a power of about 80~120W.

13. The method of fabricating a ruthenium oxide electrode as claimed in claim 6, wherein the ruthenium sputtering has a power of 100W.

14. The method of fabricating a ruthenium oxide electrode as claimed in claim 6, wherein the entrapment layer comprises epoxy resin.

* * * * *